(12) United States Patent
Chen et al.

(10) Patent No.: US 7,102,153 B2
(45) Date of Patent: Sep. 5, 2006

(54) STRAINED SILICON FORMING METHOD WITH REDUCTION OF THREADING DISLOCATION DENSITY

(75) Inventors: Pang-Shiu Chen, Hsinchu (TW); Sheng-Wei Lee, Taipei (TW); Lih-Juann Chen, Hsinchu (TW); Chee-Wee Liu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/919,323

(22) Filed: Aug. 17, 2004

(65) Prior Publication Data

US 2005/0045870 A1    Mar. 3, 2005

(30) Foreign Application Priority Data

Aug. 29, 2003    (TW) .............................. 92123997 A

(51) Int. Cl.
*H01L 29/06* (2006.01)
(52) U.S. Cl. .............................. 257/19; 257/9; 257/18; 257/65
(58) Field of Classification Search ................. 257/19, 257/18, 9, 65
See application file for complete search history.

(56) References Cited

U.S. PATENT DOCUMENTS

| 5,614,435 A * | 3/1997 | Petroff et al. ................. 117/85 |
| 6,541,788 B1 * | 4/2003 | Petroff et al. ................. 257/21 |
| 2005/0037556 A1 * | 2/2005 | Grutzmacher ............... 438/197 |

* cited by examiner

*Primary Examiner*—Douglas M. Menz
(74) *Attorney, Agent, or Firm*—Bacon & Thomas, PLLC

(57) ABSTRACT

A method for growing strained Si layer and relaxed SiGe layer with multiple Ge quantum dots (QDs) on a substrate is disclosed. The method can reduce threading dislocation density, decrease surface roughness of the strained silicon and further shorten growth time for forming epitaxy layers than conventional method. The method includes steps of: providing a silicon substrate, forming a multiple Ge QDs layers; forming a layer of relaxed $Si_xGe_{1-x}$; and forming a strained silicon layer in subsequence; wherein x is greater than 0 and less than 1.

7 Claims, 5 Drawing Sheets

STRAINED SILICON FORMING METHOD WITH REDUCTION OF THREADING DISLOCATION DENSITY

BACKGROUND OF THE INVENTION

1. Field of the Invention

The present invention relates to a strained silicon substrate and the forming method thereof, more particularly, to a strained silicon substrate adapted for high-speed electronic and optical elements and the forming method thereof.

2. Description of Related Art

A strained silicon material is functioned as a substrate to various high-speed electronic elements or optoelectronic elements due to its higher electron mobility, i.e., higher carrier mobility. A strained silicon material is also applied as growing buffer layers for bonding III–V based semiconductors and IV based semiconductors, so as to integrate III–V elements (i.e. elements of group III or group V of periodic table) and IV elements (i.e. elements of group IV of periodic table) or to grow III–V elements on a silicon substrate. Since a strained silicon substrate can be integrated to grow III–V elements and IV elements to form semiconductor elements on a strained silicon-germanium epitaxy layer, and a strained silicon substrate generally replaces a silicon substrate as a substrate for growing high-speed electronics, it is commonly referred to a virtual-substrate.

Typically, a virtual-substrate is generally formed by forming a strained silicon layer over a silicon-germanium epitaxy layer on a silicon epitaxy layer. FIG. 1 is a view of a structure of the virtual-substrate. As shown in FIG. 1, the structure includes a Si substrate, a Si buffer 101, a graded silicon-germanium epitaxy layer 102, a silicon-germanium epitaxy layer 103 and a strained silicon layer 104 sequentially.

Generally, conventional silicon-germanium epitaxy layers are grown on a silicon substrate through component graded growing. The stress between silicon-germanium epitaxy layer and silicon layer is reduced by such a relaxed mechanism of component graded silicon-germanium epitaxy layer. However, when better-relaxed effect is needed, the growing time of silicon-germanium growth is too long and the thickness of a relaxed silicon-germanium epitaxy layer is too high. In addition, the alignment of pattern formation through lithography is difficult, too. Hence, no advantage in mass-production can be taken. Furthermore, a silicon-germanium epitaxy layer formed by such component-graded growth has high surface roughness, threading dislocation density and defective density, so that operation ability of electronic elements (or optoelectronic elements) to be grown completely is relatively weakened.

As cited, a heterogeneous graded epitaxy layer of thick silicon-germanium with low defective density grown by high temperature is disclosed in U.S. Pat. No. 5,221,413, which does not improve prior high thickness and long growth time as well as mass-production. In addition, the cited high roughness is improved by selecting special substrate materials (U.S. Pat. No. 6,033,803). However, mass-production of high-speed electronic elements or optoelectronic elements by improving high thickness, high roughness and long growth time at the same time does not present in current processes or products.

Therefore, it is desirable to provide an improved method to mitigate and/or obviate the aforementioned problems.

SUMMARY OF THE INVENTION

An object of the present invention is to provide a forming method of strained silicon substrate, which uses multiple quantum dots (QDs) to decrease defective density, reduce or relax strain and surface roughness of epitaxy layers, and further shorten growth time for forming epitaxial layers, thereby enhancing operation properties of device.

Another object of the present invention is to provide a multilayer substrate with strained silicon, which can decrease defective density, reduce surface roughness of epitaxy layers and further shorten growth time for forming epitaxy layers, thereby improving operation properties of device.

A further object of the present invention is to provide a stain relaxed mechanism of silicon-germanium epitaxy layers, which can decrease defective density, reduce surface roughness of epitaxy layers, provide a substrate for forming electronic elements and further improve operation properties of high-speed electronics.

To achieve the object of the present invention, the forming method of strained silicon substrate includes: providing a silicon substrate; forming a silicon-germanium buffer layer with multiple Ge quantum dot on the silicon substrate; forming a $Si_xGe_{1-x}$ layer on the buffer layer, where $0<x<1$; and forming a strained silicon layer on the $Si_xGe_{1-x}$ layer, where $0<x<1$.

The inventive strained silicon substrate includes: a silicon substrate; a strained silicon layer; a silicon-germanium buffer layer with multiple Ge quantum dots sandwiched between the silicon substrate and the relaxed $Si_xGe_{1-x}$ layer strained silicon layer; and a $Si_xGe_{1-x}$ layer sandwiched between the strained silicon layer and the silicon-germanium buffer layer with multiple quantum dots, where $0<x<1$.

Other objects, advantages, and novel features of the invention will become more apparent from the following detailed description when taken in conjunction with the accompanying drawings.

DETAILED DESCRIPTION OF THE PREFERRED EMBODIMENT

Quantum dots adapted for the buffer layer with multiple Ge quantum dots of the present invention can be any materials of III–V quantum dots (i.e. quantum dots of elements of group III or group V of periodic table) or IV quantum dots (i.e. quantum dots of elements of group IV of periodic table). Preferably, quantum dots adapted for the buffer layer with multiple Ge quantum dots of the present invention are germanium (Ge) quantum dots, silicon-germanium quantum dots, silicon:carbon quantum dots or silicon-germanium-carbon quantum dots. Average space between quantum dots in each layer is not limited in the buffer layer with multiple silicon-germanium quantum dots, preferably in a range of 10~50 nm. Density of quantum dots is also not limited in the buffer layer with multiple silicon-germanium quantum dots layers, preferably in a range of $10^{10}$~$10^{11}$ cm$^{-2}$. Layer number of quantum dots is also not limited in the buffer layer with multiple silicon-germanium quantum dots, preferably below 20 layers, even below 10 layers. Thickness of silicon spacer layer between germanium/silicon bilayers is also not limited in the buffer layer with multiple silicon-germanium quantum dots, preferably in a range of 30~50 nm. A method for forming quantum dots in the buffer layer with multiple silicon-germanium quantum dots can be any appropriate method for growing epitaxy quantum dots in this field, preferably chemical vapor deposition (CVD), ultra-high vacuum CVD (UHV/CVD) or molecular epitaxy. Shape of a quantum dot is not limited in the buffer layer with multiple silicon-germanium quantum dots, preferably in a semi-sphere or a drop-shape. Most threading dislocation density of silicon-germanium buffer layer is below $10^9$ cm$^{-2}$ in the buffer layer with multiple silicon-germanium quantum dots, preferably below $5 \times 10^5$ cm$^{-2}$. The inventive strained silicon can be applied to produce various electronic elements or devices, preferably to optoelectronic elements or high-speed electronic elements.

An embodiment for forming stained silicon substrate is given in the following for better understanding.

[Formation of Strained Silicon Substrate of the Embodiment]

Figure 1:
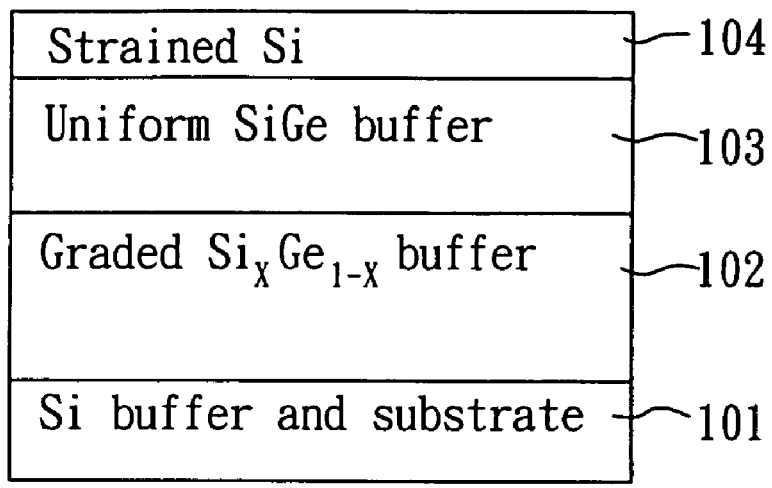
FIG. 1 is a cross-sectional view of a typical virtual-substrate of graded silicon-germanium epitaxy layers.
Figure 2:
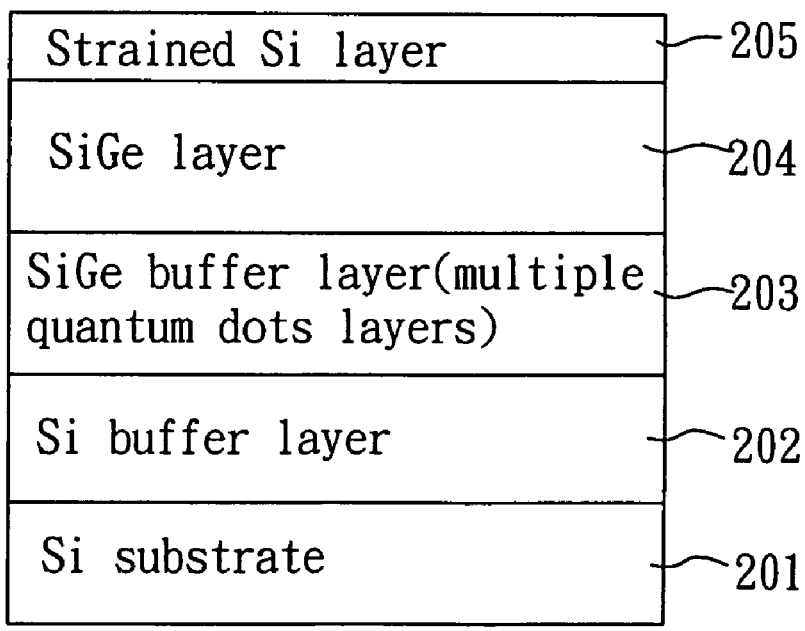
FIG. 2 is a cross-sectional view of a strained silicon substrate with low dislocation according to an embodiment of the invention.
Figure 3:
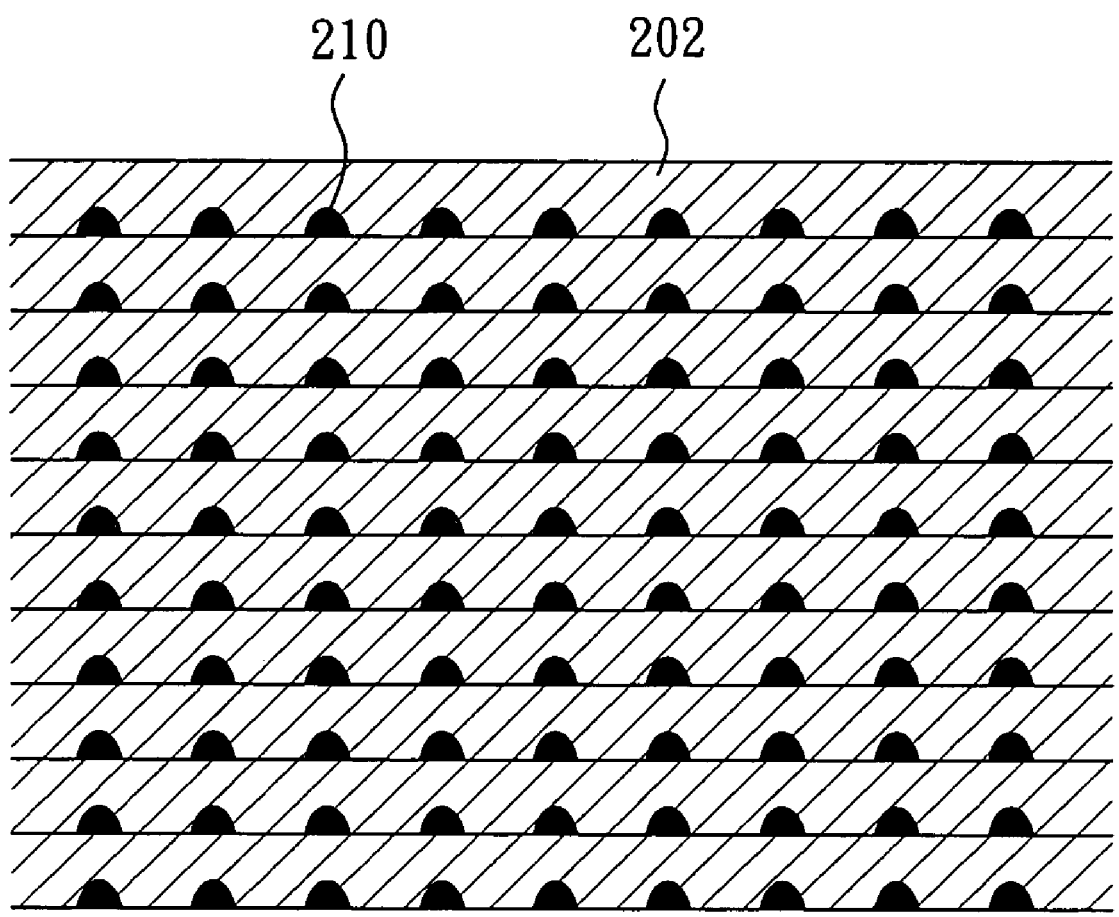
FIG. 3 is a cross-sectional view of the detail of FIG. 2 according to the embodiment of the invention.

FIG. 2 is a structure of a strained silicon substrate with low dislocation. As shown in FIG. 2, the structure includes steps of forming a silicon buffer layer 202 on a silicon substrate 201, forming a set of 10 layers with Ge quantum dots 210 (FIG. 3) in the silicon buffer layer 202, which is separated by a spacer forming of a 20-nm-thick Si layer 203, and forming a relaxed silicon-germanium layer 204 and then a strained silicon layer 205 over the Ge quantum dots 210. The cited quantum dots are further shown in FIG. 3.

The inventive method for forming a strained silicon structure with low dislocation density firstly applies UHV/CVD to silicon growth layer by layer for smoothening the surface of a chip. Sequentially, 10 layers with quantum dots isolated by a 20-nm-thick Si layer are formed and a following 500 nm relaxed silicon-germanium layer is grown.

When system strain is relaxed, nucleus of mismatch dislocation is formed preferentially at local areas of quantum dots because stress is collected in the local areas, and thus relaxed silicon-germanium layer epitaxy layers with high-level strained relaxation and low defective density are left.

[Property Verification for Strained Si Substrate]

The cited strained Si substrate with multilayers and low dislocation density is subjected to an atomic force microscope (AFM) for the surface roughness measurement. The resulting surface roughness is 3 nm much smaller than that (6 nm) of SiGe epitaxy layer using the prior graded growth. Accordingly, the surface roughness of the inventive substrate with low dislocation density is superior to that of the SiGe epitaxy formed by the prior graded growth.

Figure 4:
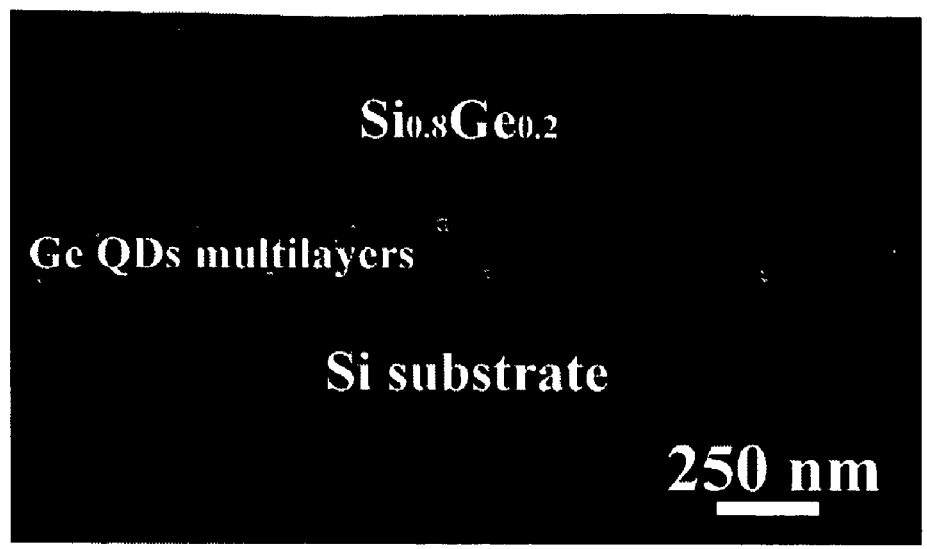
FIG. 4 is a cross-sectional view of strained silicon, with the aid of a transmission electron microscope, according to the embodiment of the invention.
Figure 5:
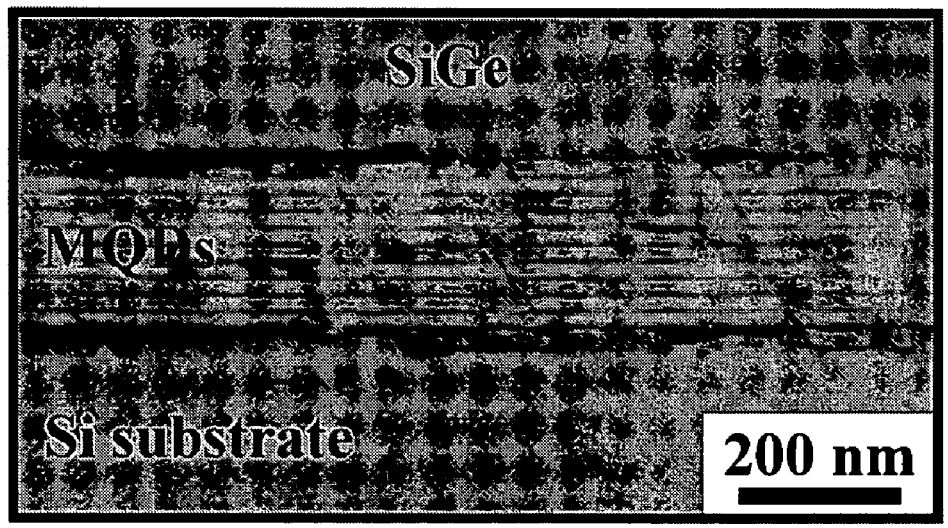
FIG. 5 is an enlarged cross-sectional view of strained silicon, with the aid of a transmission electron microscope, according to the embodiment of the invention.

To better understanding, an electron microscope is applied to observe the strained Si substrate with multilayers and low dislocation density. As a result shown in FIGS. 4 and 5, the strained Si substrate has a threading dislocation density of $2 \times 10^5$ cm$^{-2}$ much smaller than that ($1 \times 10^9$ cm$^{-2}$) of the SiGe epitaxy formed by the prior graded growth.

Figure 6:
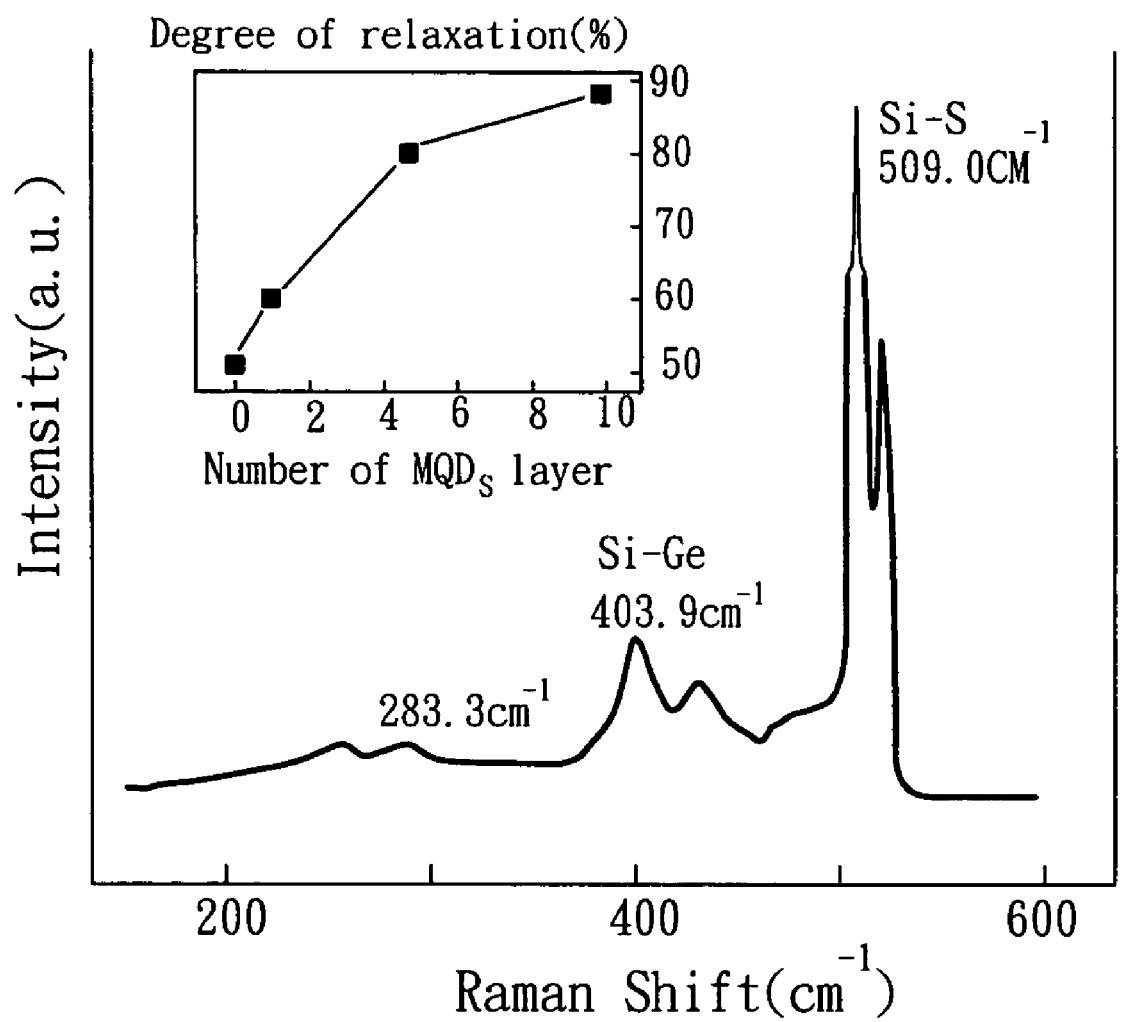
FIG. 6 is a graph of a peak-Raman shift relation, produced by changing number of multiple germanium/silicon bilayers in strained silicon substrate, according to the embodiment of the invention.
Figure 7:
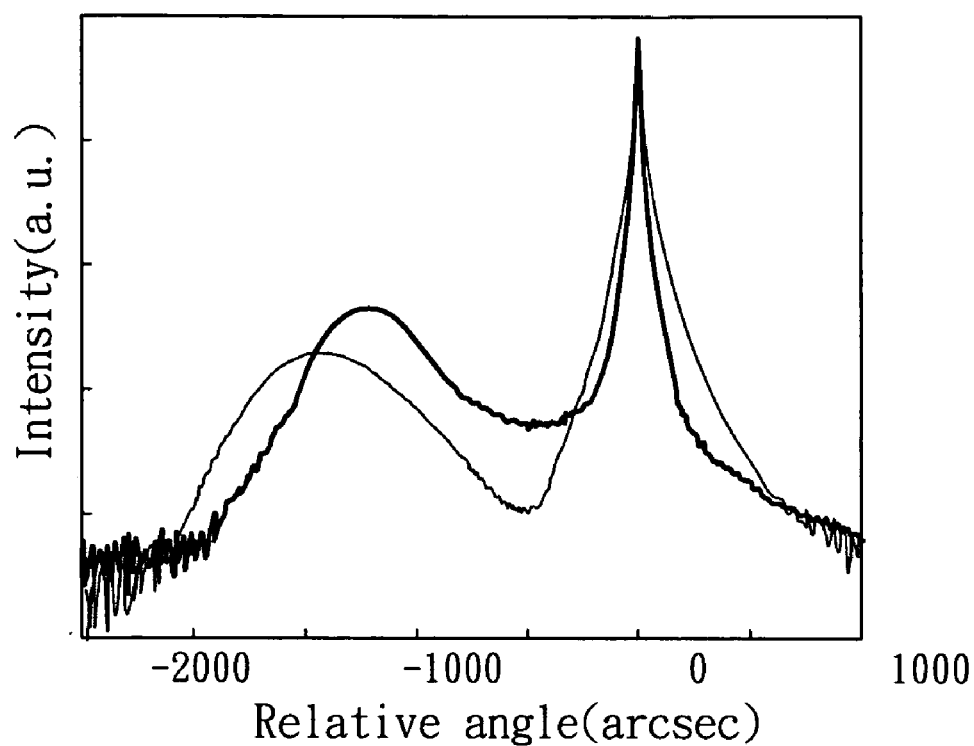
FIG. 7 is a graph of X-ray diffraction spectrum of strained silicon and relaxed SiGe according to the embodiment of the invention.
Figure 8:
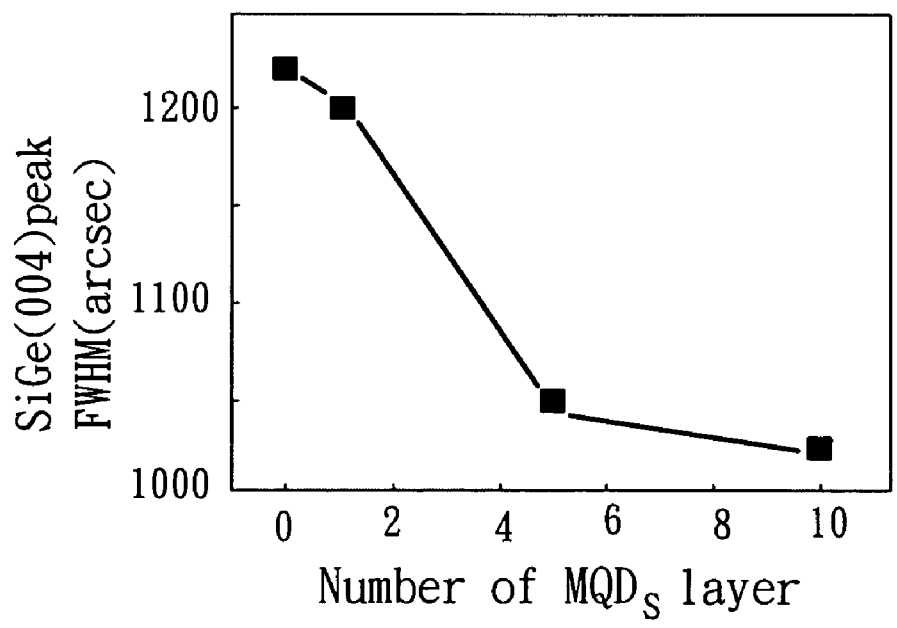
FIG. 8 is a graph of an X-ray-peak to number-of-layer relation, produced by changing number of multiple germanium/silicon bilayers in strained silicon substrate, according to the embodiment of the invention.

When a Raman spectrum is applied to observe the strained Si substrate with multiple germanium/silicon bilayers and low dislocation density, its peak changes with changing number of layer. As a result shown in FIG. 6, the relaxation effect is better as increasing the number of Si buffer layers with multiple Ge quantum dots. When an X-ray diffraction is applied to observe the strained Si substrate with multilayers and low dislocation density, its relaxation is improved as compared to the prior SiGe epitaxy with the same thickness. As shown in FIG. 8, improved level of the relaxation is more obvious as increasing the number of multiple Ge quantum dots.

As cited, the strained Si substrate formed by the inventive method obviously has lower defective density than those of the prior graded SiGe buffer epitaxy and the roughness of the inventive epitaxy is relatively reduced, thereby enhancing operation properties of high-speed electronic elements (or optoelectronic elements). Besides, as compared to the prior graded SiGe epitaxy, the invention has better relaxation and less thickness for growth is required for forming the inventive strained Si substrate and further growth time for forming the epitaxy is relatively reduced. Therefore, the inventive strained substrate can be applied to operation properties of high-speed electronic elements for a growth substrate.

Although the present invention has been explained in relation to its preferred embodiment, it is to be understood that many other possible modifications and variations can be made without departing from the spirit and scope of the invention as hereinafter claimed.

What is claimed is:

1. A strained silicon substrate, comprising:
   a silicon substrate;
   a strained silicon layer;
   a silicon-germanium buffer layer with multiple silicon-germanium quantum dots and multiple silicon layers, sandwiched between the silicon substrate and uniform $Si_xGe_{1-x}$ layer; and
   a uniform $Si_xGe_{1-x}$ layer, sandwiched between the strained silicon layer and the silicon-germanium buffer layer with multiple silicon-germanium quantum dots, wherein $0<x<1$.

2. The strained silicon substrate as claimed in claim 1, wherein the silicon-germanium buffer layer has a density of silicon-germanium quantum dots ranged between $10^{10}$ cm$^{-2}$ and $10^{11}$ cm$^{-2}$ in each layer.

3. The strained silicon substrate as claimed in claim 1, wherein a thickness of silicon space between silicon-germanium quantum dots in the silicon-germanium buffer layer ranges between 10 nm and 50 nm.

4. The strained silicon substrate as claimed in claim 1, wherein a thickness of the silicon layer in the silicon-germanium buffer layer ranges between 20 nm and 50 nm.

5. The strained silicon substrate as claimed in claim 1, wherein the $Si_xGe_{1-x}$ layer has a thickness ranged between 200 nm and 1000 nm.

6. The strained silicon substrate as claimed in claim 1, wherein the silicon-germanium buffer layer has a threading dislocation density less than $5 \times 10^5$ cm$^{-2}$.

7. The strained silicon substrate as claimed in claim 1, further comprising an optoelectronic or electronic element with the strained silicon substrate.

* * * * *